United States Patent
Sinha et al.

(10) Patent No.: US 6,986,113 B2
(45) Date of Patent: Jan. 10, 2006

(54) METHOD FOR ESTIMATING SUBSTRATE NOISE IN MIXED SIGNAL INTEGRATED CIRCUITS

(75) Inventors: Snehamay Sinha, Dallas, TX (US); Bipasha Ghosh, Bangalore (IN); Raghu Nandan Srinivasa, Bangalore (IN); Stephen N. Kiel, Mission Viejo, CA (US)

(73) Assignee: Texas Instruments Incorporated, Dallas, TX (US)

( * ) Notice: Subject to any disclaimer, the term of this patent is extended or adjusted under 35 U.S.C. 154(b) by 46 days.

(21) Appl. No.: 10/705,594

(22) Filed: Nov. 10, 2003

(65) Prior Publication Data

US 2004/0187085 A1 Sep. 23, 2004

Related U.S. Application Data

(60) Provisional application No. 60/424,907, filed on Nov. 8, 2002.

(51) Int. Cl.
*G06F 17/50* (2006.01)
(52) U.S. Cl. .................................... 716/4; 716/5; 716/6
(58) Field of Classification Search ............... 716/4–6, 716/8–11; 703/14–16
See application file for complete search history.

(56) References Cited

U.S. PATENT DOCUMENTS

| | | | | |
|---|---|---|---|---|
| 5,481,484 A | * | 1/1996 | Ogawa et al. | 703/14 |
| 6,291,322 B1 | * | 9/2001 | Clement | 438/510 |
| 6,553,542 B2 | * | 4/2003 | Ramaswamy et al. | 716/2 |
| 6,725,185 B2 | * | 4/2004 | Clement | 703/14 |
| 6,898,769 B2 | * | 5/2005 | Nassif et al. | 716/5 |
| 2001/0029601 A1 | * | 10/2001 | Kimura et al. | 716/19 |
| 2002/0045995 A1 | * | 4/2002 | Shimazaki et al. | 702/77 |
| 2002/0147555 A1 | * | 10/2002 | Nagata et al. | 702/70 |
| 2003/0172358 A1 | * | 9/2003 | Alon et al. | 716/1 |
| 2003/0229874 A1 | * | 12/2003 | Saito et al. | 716/8 |

* cited by examiner

*Primary Examiner*—Matthew Smith
*Assistant Examiner*—Naum B. Levin
(74) *Attorney, Agent, or Firm*—J. Dennis Moore; W. James Brady, III; Frederick J. Telecky, Jr.

(57) ABSTRACT

A method for estimating noise in an integrated circuit substrate. A model file is created for a technology process for fabricating the integrated circuit. Noise generated by a digital circuit and input/output circuitry to be implemented in the integrated circuit are estimated. A substrate netlist is generated for the integrated circuit. A floorplan is determined for the integrated circuit. Transient simulations are run with predetermined input values. Finally, it is determined if predetermined noise requirements are met in results of the transient simulations.

4 Claims, 6 Drawing Sheets

METHOD FOR ESTIMATING SUBSTRATE NOISE IN MIXED SIGNAL INTEGRATED CIRCUITS

This application claims priority under 35 U.S.C. 119(e)(1) of provisional application No. 60/424,907, filed Nov. 8, 2002.

TECHNICAL FIELD OF THE INVENTION

This invention relates to integrated circuits, and more particularly relates to optimization of integrated circuit designs in order to reduce noise generated in integrated circuits implementing such designs.

BACKGROUND OF THE INVENTION

Fabrication of integrated circuits (ICs) generally involves a sequence of steps intended to take a concept, such as the concept of a digital video encoder, and from it design an integrated circuit, which can be fabricated in large quantities for sale to users. These steps are, typically, (1) initial functional and behavioral design and simulation, based on the concept, (2) circuit/netlist design and simulation, based on the behavioral design, (3) mask design, auto-device generation and on-line verification, based on the netlist, to generate a GDSII database embodying the physical design of the IC, (4) design rule, electric rule and layout-versus-schematic (LVS) verification, (5) fabricating sample ICs using the GDSI database, (6) testing the sample ICs, and, finally, (7) fabricating ICs in quantity.

One problem that IC designers must address is that of substrate noise. This is noise that is generated during normal operation of the IC, typically from signal transitions on signal lines or in devices, and that is coupled through the substrate to other locations in the IC where the noise is picked up and adversely affects performance at the other locations. Optimization of IC performance frequently includes analysis and minimization of such substrate noise.

The problem of substrate noise can be particularly problematic in mixed signal IC designs. In such designs, substrate noise analysis is essential for avoiding any performance degradation or failure due to the noise coupled through the substrate from the noisy digital circuits, i.e, the digital core, to the sensitive analog circuits. It is also important to analyze mixed signal IC designs for substrate noise sensitivity early in the design cycle, so that the design teams have sufficient time to take steps to create effective on-chip electrical isolation strategy without extensive and costly re-design cycles.

In mixed signal IC design, analyzing substrate noise generally has three parts: (1) estimating the noise generated by the digital circuits, (2) characterizing the propagation of such noise through the substrate, and (3) characterizing the resulting manifestation of such noise in analog circuits, including the impact of various isolation and noise reduction techniques on the analog circuits. Such analysis in large mixed signal ICs, involving multi-million gate designs, is especially difficult.

Existing approaches for estimating noise generation in large mixed signal designs involves characterizing all the cells used in the design and creating a noise macro model for each cell. This model is then used in conjunction with the switching activity report generated during a gate level simulation to estimate the total current being injected into the substrate. However, to follow this methodology, one needs to (1) do a full library characterization, which is time consuming, and (2) have a full gate level netlist before any simulations can be done. This methodology also cannot fully account for different process technologies, for example the use of deep NWELL or deep PWELL, without doing extensive recharacterization of the library. It also cannot do a "what-if" type analysis of the effect of decoupling capacitors, unless they are included as part of the gate level netlist. Thus, for accurate substrate noise estimation for effective reduction, a significant application of design resources must be applied, adding to the cost of the IC design.

SUMMARY OF THE INVENTION

The present invention provides a method for substrate noise estimation which enables analysis at the architectural stages of a mixed signal integrated circuit design. A model file is created for a technology process for fabricating the integrated circuit. Noise generated by a digital circuit and input/output circuitry to be implemented in the integrated circuit are estimated. A substrate netlist is generated for the integrated circuit. A floorplan is determined for the integrated circuit. Transient simulations are run with predetermined input values. Finally, it is determined if predetermined noise requirements are met in results of the transient simulations.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

The present invention provides a method for substrate noise estimation which enables analysis at the architectural stages of a mixed signal IC design. Embodiments of the present invention provide (1) estimation of the noise generated by the digital core and I/O circuits, (2) estimation of the effect of decoupling capacitors on the noise in the power and ground lines, (3) estimation of the noise coupling through the substrate to the analog blocks, and analysis of the effect of this noise on the performance of the analog circuits, and (4) estimation of the optimum number of power/ground pads needed and the power supply schemes to be used for minimizing noise. These embodiments may be used to analyze noise coupling in a particular substrate by analyzing the process technology for layout guidelines, and by analyzing the floorplan for the IC. Using the floorplan for the IC, the placement of noisy circuits and of noise-sensitive circuits can be analyzed to see how much isolation is needed to reduce the noise coupling to the level demanded by the IC specifications, and what can be done to achieve that level of isolation.

In addition, embodiments of the present invention provide the capability for a quick "what-if" analysis of the above features without resorting to extensive library characterization and gate level simulations to obtain the switching activity reports. They can handle structures like a deep NWELL or a deep PWELL without recharacterization of the library, since the substrate netlist is generated from the floorplan and not included as part of the model for the digital core. These can be done at the architectural design stages of the design to estimate effects of power routing strategy, circuit isolation strategy, different circuit designs, and other such options.

Figure 1:
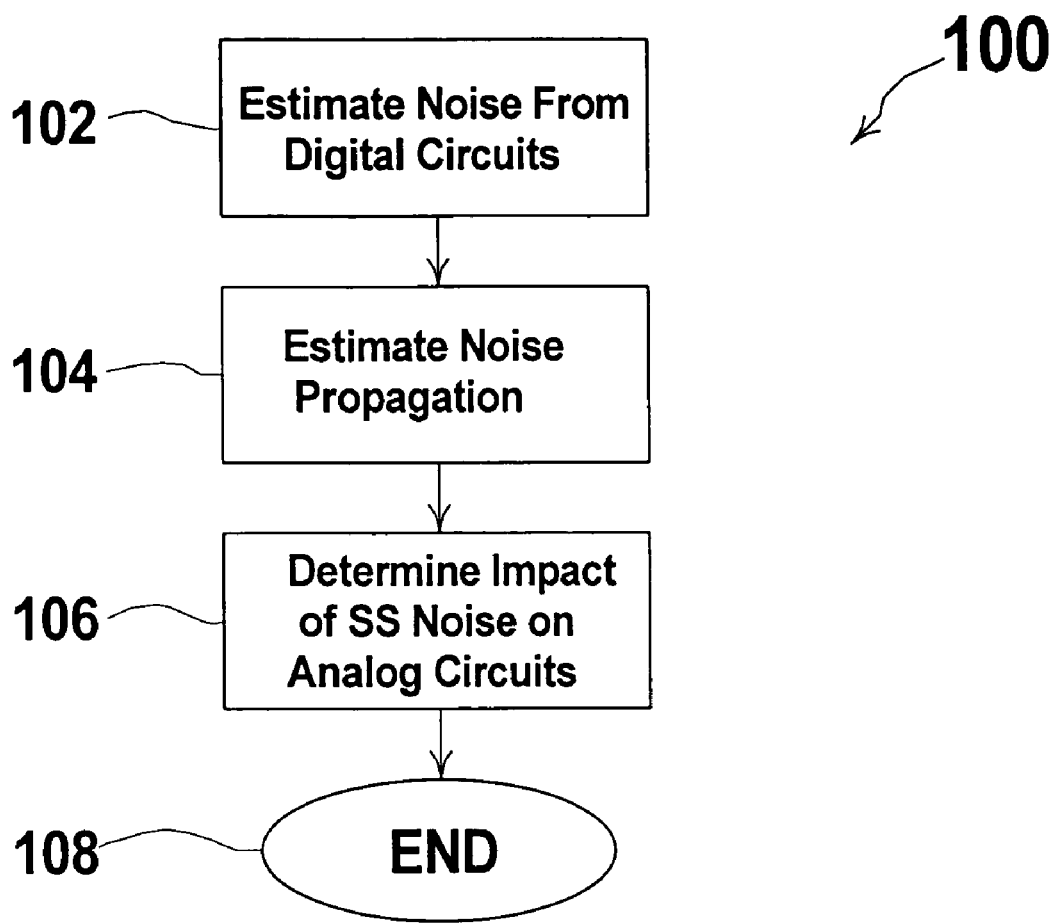
FIG. 1 is a flow chart of the present invention, in its broader aspects.

In its broadest form, the present invention comprises three steps, as shown at 100 in FIG. 1. First, the noise generated by digital circuits, i.e. the "core," in the IC is estimated 102. Then, the propagation of that noise through the IC substrate is estimated 104. Finally, the impact of that substrate noise on analog circuits in the IC is determined 106, at which point the method is finished 108.

The core noise estimate is based on the assumptions that most of the noise injected into the substrate comes from the power/ground busses, and that the peak and root-mean-square ("rms") values of this noise are dependent on the power consumed by the core and on the frequency of operation, and are independent of the actual circuit and actual switching activity. While this does not give an exact waveform of the noise generated by the core circuits, it does provide a reasonably accurate estimation of the noise so generated, in terms of its peak and rms values.

Figure 2:
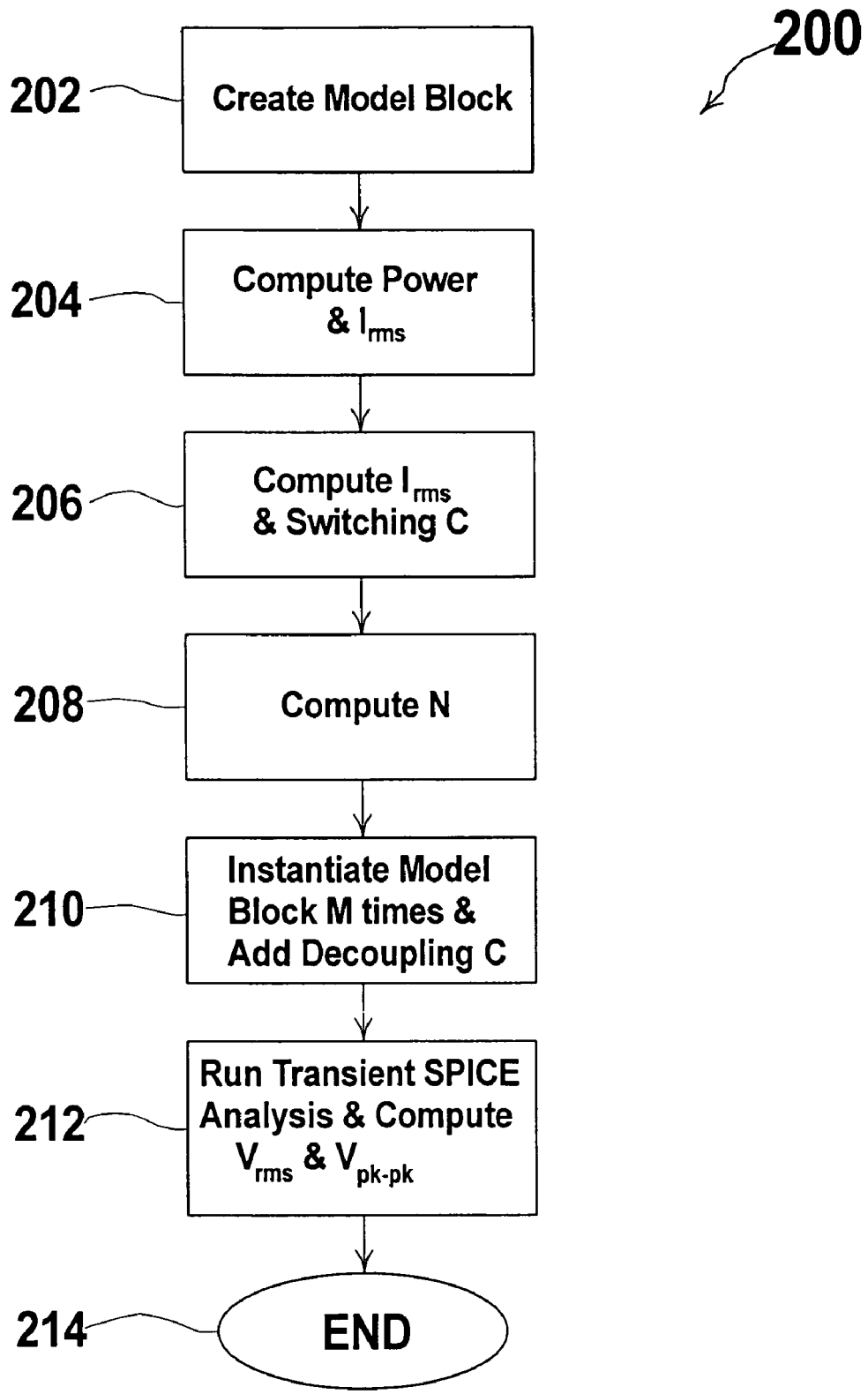
FIG. 2 is a flow chart of the steps taken to estimate the noise generated by core circuits, in the preferred embodiment.

In the preferred embodiment, the steps taken to estimate the noise generated by the core circuits are as follows, as shown in FIG. 2. First, a computer file of a model block is created, which contains a chain of inverters and buffers and a representative number of flip-flops 202. (It will be understood that hereinafter references to creation of blocks or circuits, or their representation, and the like, refer to the creation and manipulation of computer files representing those entities and their associated parameters.) In this model block, $V_{DD}$ and $V_{ss}$ lines are provided, as well as a simple LR representation of the bondwire inductance and resistance. The specific circuit designed for this model will depend upon the block the model is designed to approximate. The idea is to allow an approximate representation of the signal switching, as it would occur over time during operation of the core block, by running a simulation of the model circuit. Second, the power and rms current, $I_{rms}$ (model), of the core block are computed, for a clock frequency of f 204. For this computation, the equation:

$$P=CV^2f=I_{rms}(\text{model})V \qquad \text{Eq.(1)}$$

is used, where P is the power of the block, C is the switching capacitance of the model block, and V is the voltage across it. Third, the $I_{rms}$ and switching capacitance of the actual digital blocks in the chip, for example, a digital signal processor ("DSP") block, microprocessor block, glue logic block, custom macro block, etc., are computed 206 from the power value computed in step 204. For this computation, the equation:

$$P=CV^2f=I_{rms}(\text{model})V \qquad \text{Eq.(2)}$$

is used, where C is the capacitance of the actual digital block, and V is the voltage across it. Fourth, the number of instances N of the model block that are needed to match the actual computed power (or, equivalently, the $I_{rms}$) values (from step 206) is computed 208. For this computation, the equation:

$$N=I_{rms}/I_{rms}(\text{model}) \qquad \text{Eq.(3)}$$

is used. Fifth, the model block is instantiated M times 210. For this computation, the equation:

$$M=N/\alpha \qquad \text{Eq.(4)}$$

is used, where a is a factor selected to reduce the simulation time. This step results in a decrease in the computed $I_{rms}$(model) by the factor $\alpha$. To compensate for this, since a goal is to compute the root-mean square and peak-to-peak voltages, $V_{rms}$ and $V_{pk-pk}$, respectively, seen at the power and ground lines, the bond wire L and R values are increased by the factor $\alpha$, in order to maintain Ldi/dt+IR invariant. Decoupling capacitance is added between the power supply and ground of the model block, instantiated M times. The value of the decoupling capacitance is selected to be a value that can actually be added to the IC. For example, this value may be between two times and ten times the switching capacitance computed in step 206, above. Finally, a transient SPICE analysis is run to provide the output voltage as a function of time, and the values $V_{rms}$ and $V_{pk-pk}$ are computed 212. This completes the estimation of the core noise 214.

Next the input/output ("I/O") noise is estimated. In the preferred embodiment, the I/O noise is estimated by simulating the IC floorplan along with the actual I/O buffers as noise sources, and with the analog-to-digital ("ADC") sampling network as receptors. This may be done with any of a number of commercially available software programs that, for example, extract the substrate RC netlist using a three dimensional profile of the substrate. The netlists of the I/O buffers and the ADC sampling network may be generated from the schematics, since layouts are typically not available at the early design stage when analysis of the kind provided by embodiments of the present invention is desired. If such schematics are not available, and analysis of this kind is desired anyway, the impedance to ground seen at the receptor node of the substrate may be assumed, and the simulations, as described herein, may be run. In this way, it is possible to check at a very early stage to determine if the noise specification at the receptor is exceeded, to a good approximation.

Figure 3:
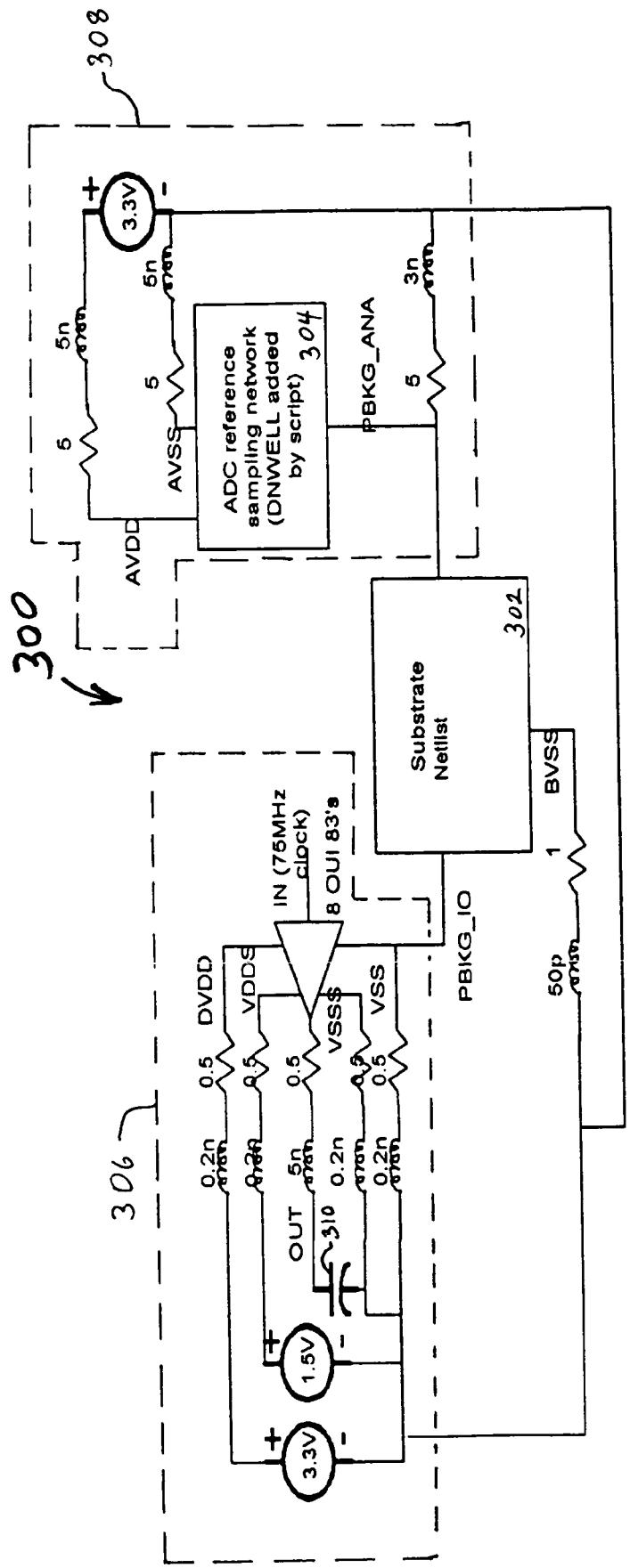
FIG. 3 is a block diagram of an exemplary substrate netlist used in the preferred embodiment of the present invention.

The I/O terminal of the substrate netlist is connected to the substrate connection of the I/O buffer schematic netlist. The substrate connection of the critical analog circuit, say the ADC circuit, for example, is connected to the corresponding terminal of the substrate network. FIG. 3 shows an exemplary network 300 of this kind. A block 302 representing the substrate netlist of the IC floorplan, for example as derived from a commercial program, as mentioned above, is shown in the figure, as well as a block 308 representing the critical analog circuit, in this case an ADC circuit, including a netlist 304 of the ADC circuit. Circuitry 306 representing the I/O buffer is also shown. The entire network, comprising the substrate netlist 302, the I/O buffer 306, with its load capacitance 310, and the critical analog circuit 308 may be compared across different test cases, for example with and without backside connection, with and without guard rings, the electrostatic discharge ("ESD") $V_{ss}$ ring being shorted to or separated from the scribe seal, and other options, as desired by one implementing and employing the present invention. Since the worst case scenario in the example chosen to explain this embodiment is that eight I/O buffers can switch simultaneously, eight I/O buffers are used, each driving the typical load of 40 pF that the exemplary IC embodiment would see. The backgate contacts of the I/O buffers are connected to an I/O access port of the substrate netlist, and the back gate contacts of the ADC sampling network are connected to the receptor (i.e., critical analog circuit) access port of the substrate netlist.

In this exemplary embodiment a 75 MHz pulse may be fed to the input of the output buffers, such that the output slew is satisfactory even for implementations that would be at the poorest extreme of the IC fabrication process variations. The same input waveform transition time may then be used with simulation parameters set to the best extreme of the IC fabrication process variations to do the noise analysis. The peak glitch may be measured across the ADC sampling capacitor (not shown), for example, or across other nodes in the circuit, to identify performance at critically noise sensitive parts of the circuit.

Figure 4:
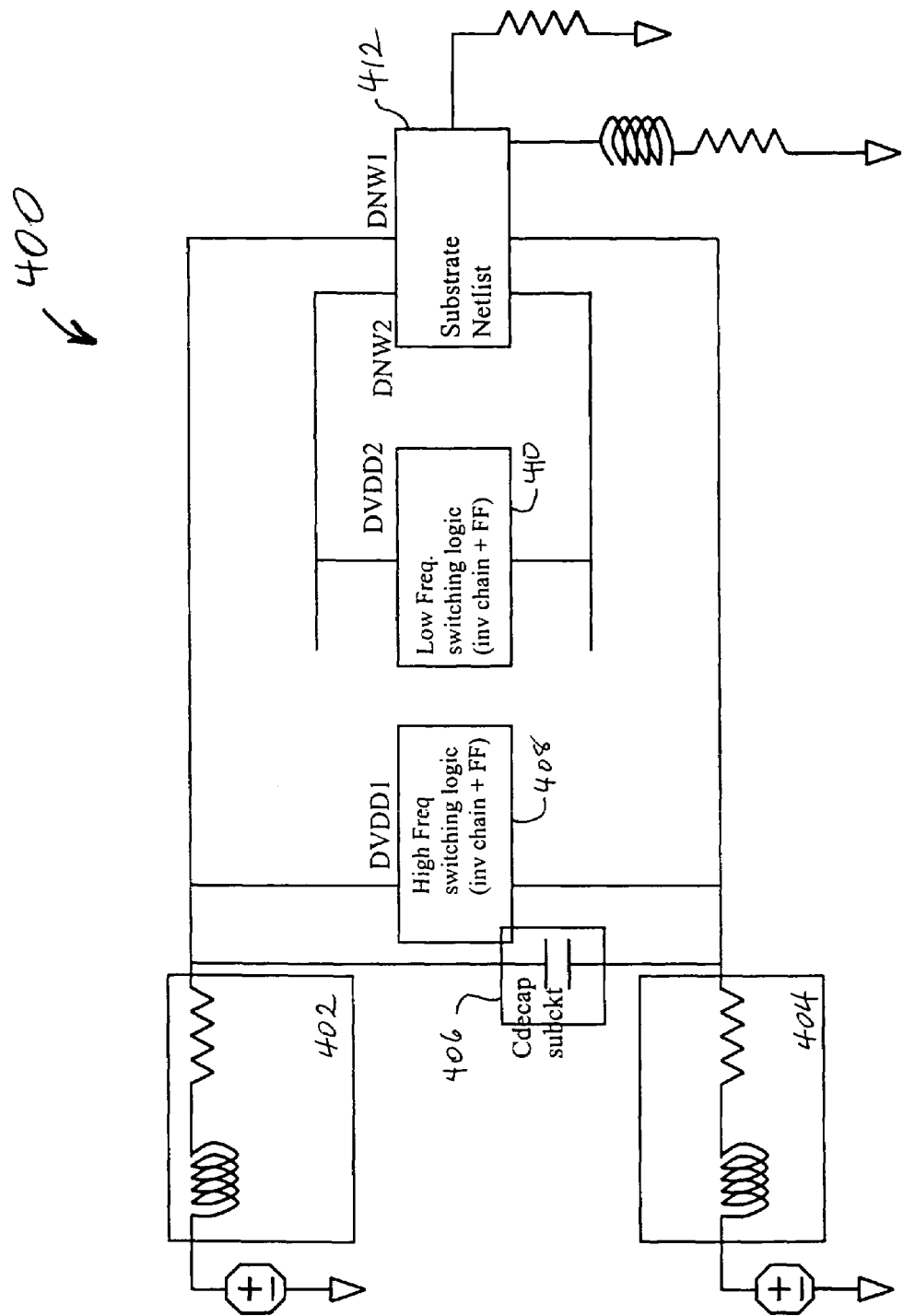
FIG. 4 is a block diagram of another substrate netlist used in the preferred embodiment of the present invention.

In the preferred embodiment of the present invention, to determine the effect of the coupled noise at the critical analog circuit, first, the substrate netlist is extracted. Again, this may be done with any of a number of commercially available software programs that, for example, extract the substrate RC netlist using a three dimensional profile of the substrate. This extraction is done in order to simulate the noise coupling from the digital core-I/O buffers into the critical analog blocks. The netlist is generated as a subcircuit with the access port names as its ports. Each noise generating block, e.g., I/O cells, DSP, microprocessor, glue logic, custom macro, etc., has one large substrate contact and one large N-Well contact. The contacts are kept large to simulate the effect of multiple small contacts, without increasing the netlist extraction time excessively. The noise receptor is also modeled as a substrate contact at the approximate location of the sensitive circuit. A diagram of the resulting netlist 400 is shown in FIG. 4. The $V_{DD}$ and ground LR representations 402 and 404, respectively, are shown, as well as the equivalent capacitance 406 between $V_{DD}$ and ground, outside of the netlists. A high frequency switching logic block is shown at 408, and a low frequency switching logic block is shown at 410, with the substrate netlist being shown at 412.

Figure 5:
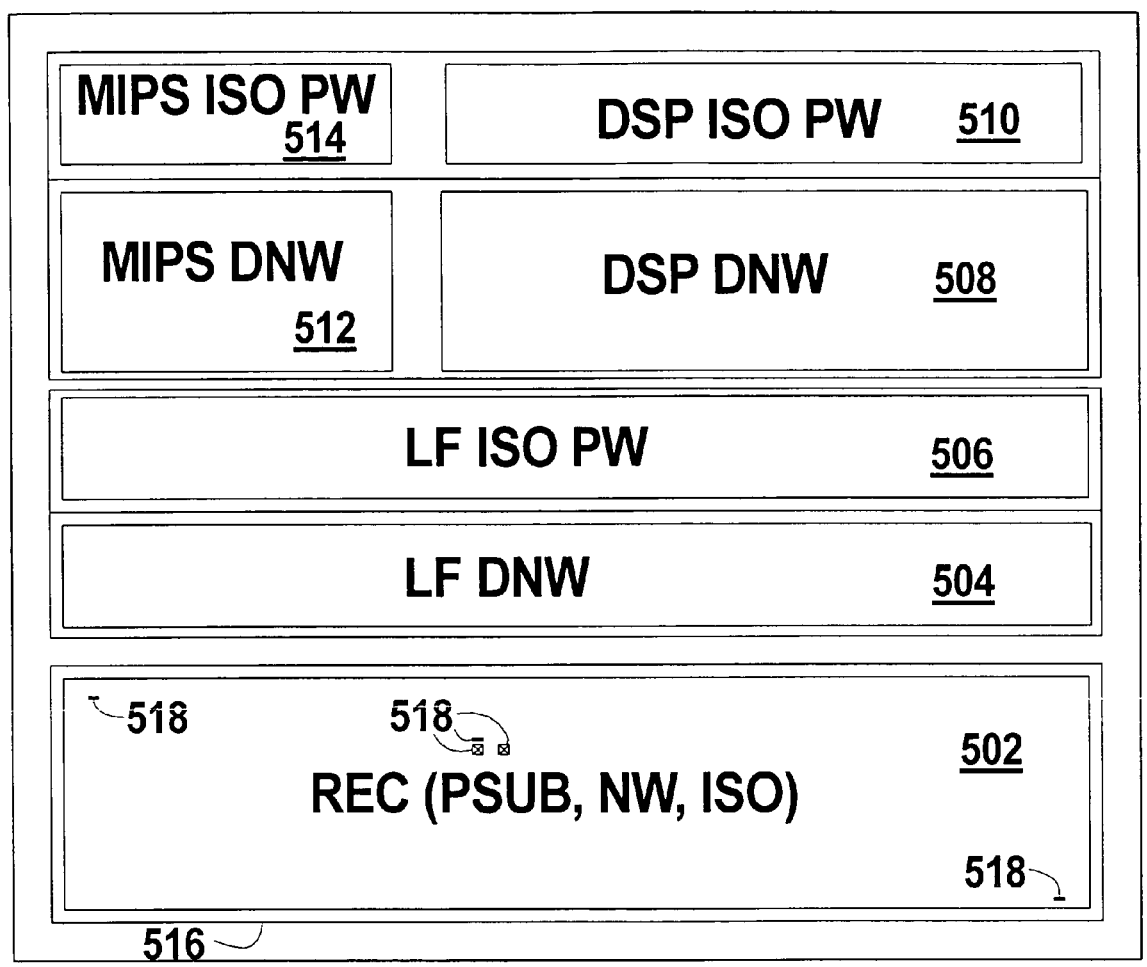
FIG. 5 is a diagram of a floorplan used in the preferred embodiment of the present invention.

Once the substrate netlist is extracted, floorplan analysis of the core and I/O noise is performed with an IC floorplan as the base layout. FIG. 5 shows such a floorplan 500 for the exemplary embodiment being described, with the analog block 502 shown, as well as the low frequency switching logic regions LF DNW 504 and LF ISO PW 506, and the DSP regions DSP DNW 508 and DSP ISO PW 510, and high frequency switching logic regions MIPS DNW 512 and MIPS ISO PW 514. The layout 500 has definite boundaries for the digital and analog blocks and the I/O buffer area. Each digital macro is defined as two access ports (NW and PSUB). The I/O buffers on the digital side are divided into three strips of access ports according to their frequency of operation and load conditions (I/Os switching at the same frequency and driving the same load are combined as one port). A guard ring 516 is put around the analog block, and several receptors, PSUB, NWELL and ISO-PWELL access ports 518, of typical size are constructed in various parts of the analog block.

To analyze the noise from switching digital core logic, the substrate and N-Well contacts for each block are connected to the DVDD and DVSS terminals of the representative digital block. The voltage output waveforms obtained from the previous simulations, discussed above, act as a PWL voltage source, and a transient SPICE analysis is done. The noise voltages, including both $V_{rms}$ and Vpk-pk, are measured at the receptor. The circuit used for the core noise simulations is the circuit shown in FIG. 4, and discussed above. Using a standardized model for a noise source and receptor cancels errors when considering alternative floorplan architectures. The optimum design may be selected in terms of decibels ("dB") of noise isolation. The noise source estimation and estimation of its propagation can be accurate enough to test the viability of alternative floorplan architectures.

Figure 6:
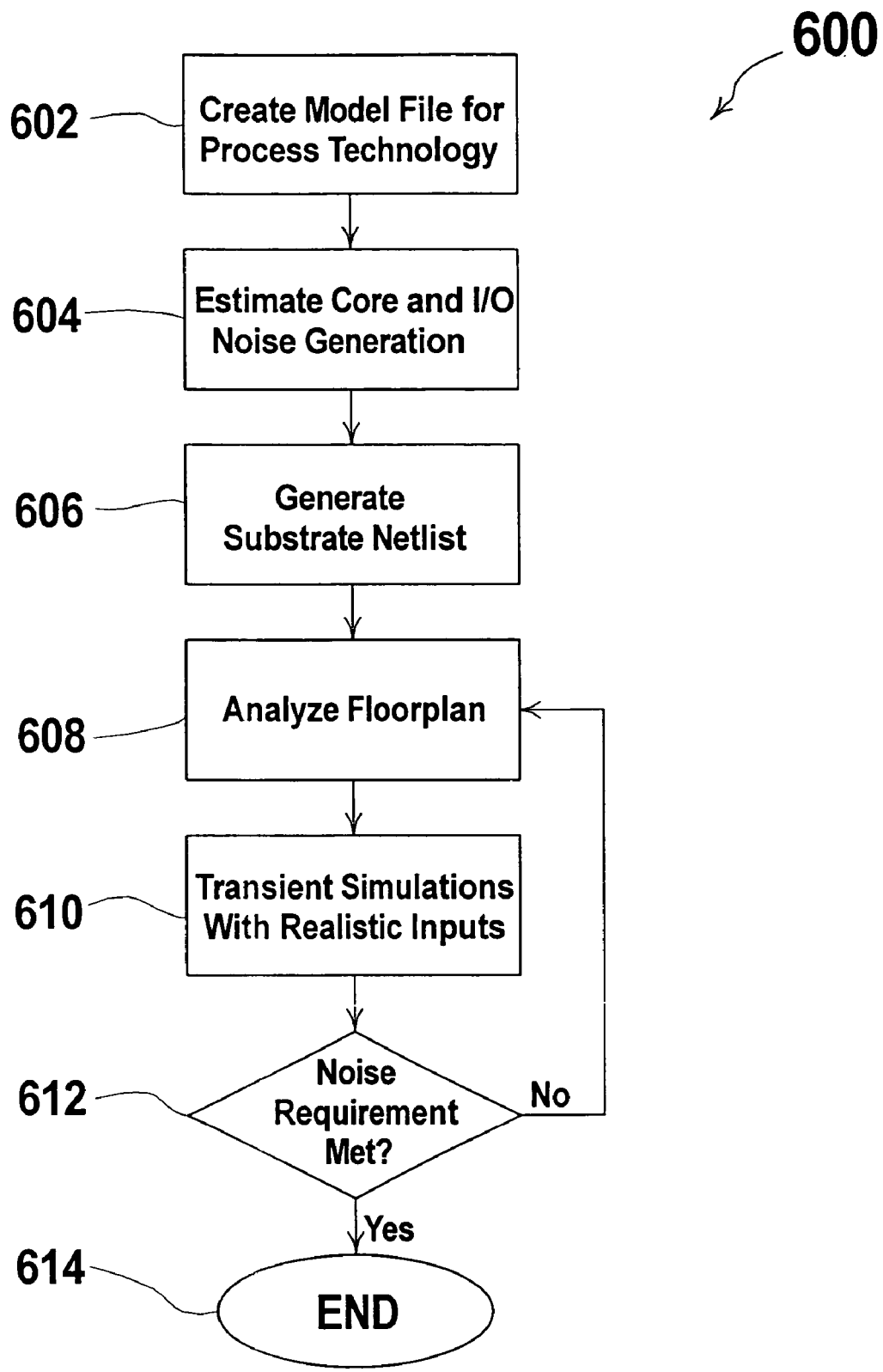
FIG. 6 is a flow chart of the preferred embodiment of the present invention.

FIG. 6 is a flow chart summarizing the method 600 of the preferred embodiment for floorplan analysis. First, a model file is generated for the process technology 602. Then, the core and I/O noise generation is estimated, using the model file 604. Then, a substrate netlist is generated 606, and is used to generate a floorplan. The floorplan is then analyzed 608, as described above. Transient simulations are run, using realistic inputs, i.e., inputs having values expected to be encountered by the circuit being designed 610. The results of the transient simulations are examined to determine if the noise requirements for the IC under design are met 612. If not, step 608 and following are run again. If the results of the noise requirements are met, however, the method is finished 614.

In summary, embodiments of the present invention allow noise analysis at the floorplanning stage of IC design, giving a design team sufficient time to make changes to design and take corrective action. It uses a minimal set of inputs, and does not need a complete RTL or gate level netlist, a complete physical layout database or a switching activity report. Embodiments of the present invention can ensure that the simulations are done in a relatively brief time, as compared with prior art methods. Since the digital noise estimation is done once, unless there are major changes to the power numbers, multiple floorplan strategies can be analyzed within a short period. For example, for a design with approximately two million digital gates, the noise analysis flow can take approximately a day, if the digital noise generation simulations are included. Once these numbers are obtained separately, the noise analysis may take as little as one to three hours, or even less, depending on the size of the substrate netlist. Further, the use of model circuits tends to cancel errors in modeling when comparing alternate floorplan architectures. Also, the computed rms noise voltage is as accurate as the power numbers used. The peak noise accuracy depends on the peak:rms ratio of the model used for the digital logic core. While the embodiments of the method of the present invention generally are not intended to provide 100% accuracy, they are fully capable of providing order of magnitude estimates that will effect the performance of the ultimate IC. In this way, time and effort are not wasted trying to get a more accurate number when the original numbers, for example, power numbers, package parasitics, etc., may themselves be less than 100% accurate.

Finally, embodiments of the method of the present invention give a designer ample ample opportunity to try out different placements, and even different layouts, for a design. The same layout may be tried with an extra process step, for example a deep N-Well or a deep P-Well, and the effect can be seen on the noise performance of the circuit. The impact of a different package model, or a backside contact for the chip, may also be tried out, and the effect on noise performance seen. The impact of having separate or merged power supplies in the digital core, the impact of the number of power supply pins in each power domain, the effect of decoupling capacitors, and any other parameter that may affect the noise performance of the circuit can be estimated.

Although the present invention and its advantages have been described in detail, it should be understood that various changes, substitutions and alterations can be made herein without departing from the spirit and scope of the invention as defined by the appended claims.

What is claimed is:

1. A method for estimating noise in an integrated circuit, the integrated circuit adapted to be supplied by a power having a predetermined supply voltage applied between a substrate and a power supply node, comprising the steps of:

estimating a core power supply noise of the integrated circuit, by providing a power dissipated by the integrated circuit when clocked at a predetermined clock freguency;

computing the current of the integrated circuit from the power dissipated and the supply voltage;

creating a model block for a technology process for fabricating the integrated circuit, the model block comprising circuitry having components which can be clocked to provide signal switching;

determining the number of model blocks that, at the predetermined clock freguency, conduct the same current as the computed current of the integrated circuit;

estimating a noise generated by the number of model blocks by performing a transient analysis on the model blocks, and representing the estimated model block noise as a model block voltage source;

estimating a noise generated by a input/output ("I/O") circuitry to be implemented in the integrated circuit, and representing the estimated I/O noise as an I/O voltage source;

generating a substrate netlist for the integrated circuit;

determining a floorplan for the integrated circuit and providing said model block voltage source and said I/O voltage source in accordance with the floorplan;

determining the noise of the integrated circuit in a selected portion of the integrated circuit using said model block voltage source and said I/O voltage source in accordance with the floorplan and the substrate netlist.

2. A method as in claim 1 wherein the step of determining the floorplan is performed by providing the model block with a substrate contact and an N-well contact.

3. A method as in claim 1 wherein the step of estimating noise is performed by running simulations of the model block at the predetermined clock frequency.

4. A method as in claim 3 wherein the step of estimating noise is performed by running simulations of the model block at the predetermined clock frequency to obtain PWL voltage waveforms, and wherein the step of determining the floorplan is performed by providing said model block voltage source as the PWL voltage waveforms.

* * * * *